July 24, 1951 A. A. ROGERS 2,561,597

AMPLIFYING CIRCUITS COMPRISING A PLURALITY OF AMPLIFICATION STAGES IN CASCADE

Filed Feb. 13, 1948 2 Sheets-Sheet 1

INVENTOR.
ALFRED A. ROGERS
BY
AGENT

July 24, 1951

A. A. ROGERS

AMPLIFYING CIRCUITS COMPRISING A PLURALITY OF AMPLIFICATION STAGES IN CASCADE 2,561,597

Filed Feb. 13, 1948

2 Sheets-Sheet 2

*INVENTOR.*
ALFRED A. ROGERS
*BY*
[signature]
AGENT

Patented July 24, 1951

2,561,597

UNITED STATES PATENT OFFICE 2,561,597

AMPLIFYING CIRCUITS COMPRISING A PLURALITY OF AMPLIFICATION STAGES IN CASCADE

Alfred A. Rogers, Chicago, Ill.

Application February 13, 1948, Serial No. 8,079

6 Claims. (Cl. 179—171)

Figure 2:
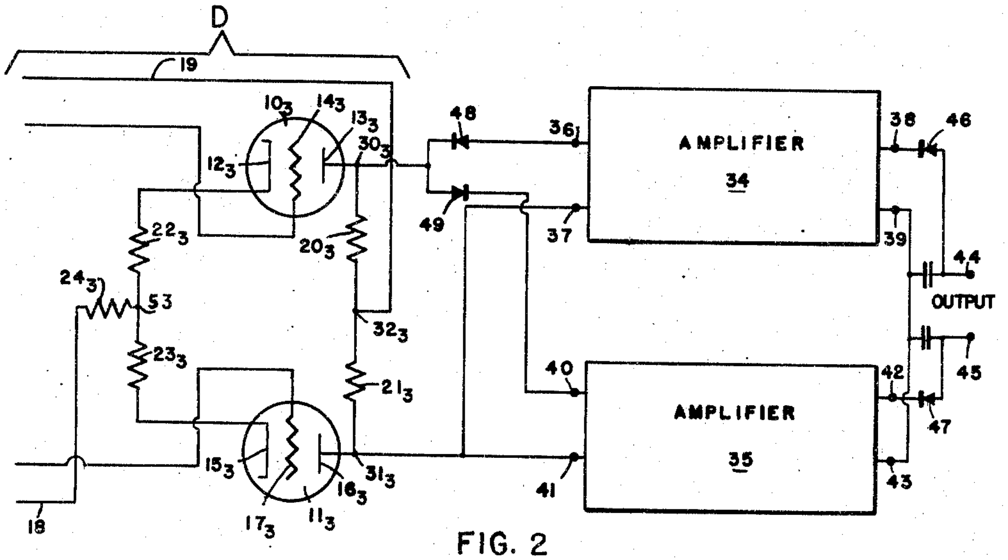

This invention relates to amplifying circuits and more particularly to amplifying circuits comprising a plurality of amplification stages in cascade.

It is a primary object of this invention to provide an amplifying circuit having balanced stages of amplification which is capable of detecting, indicating, or measuring A. C. or D. C. voltages of very small magnitudes, e. g. a few millivolts or even microvolts.

For input voltages of such small magnitudes a single amplification stage will ordinarily not suffice to produce an output voltage great enough to operate properly a conventional simple indicating instrument, e. g. a galvanometer. Additional amplification is required and it is a further object of this invention to carry out such additional amplification in such a manner that, when direct current is to be amplified, the polarity of the direct current applied to the input of the balanced stage will be preserved so that this polarity will appear at the output of the amplification stage or stages following the balanced input stage. The additional amplification may be brought about by the use of amplification stages which are either themselves balanced stages or are conventional amplifier systems.

Whether direct or alternating current is to be amplified in the circuit, the plate supply of the balanced amplification stages is alternating current.

A further object of this invention is to provide an amplifying circuit comprising a plurality of balanced stages of amplification, any two subsequent stages having plate supplies differing in phase by 180°.

It is a further object of the invention to provide an amplifying circuit comprising a plurality of balanced stages of amplification, any two subsequent stages having plate supplies differing in phase by 180°, wherein means are provided to store a portion of the output voltage of the respective preceding balanced stage so that when the respective subsequent balanced stage becomes conductive, at which time said preceding balanced stage has become non-conductive, voltage is available for being amplified in said subsequent stage.

A further object of the invention is to provide an amplifying circuit having at least two balanced stages of amplification each comprising two tubes, or two sets of tubes, in bridge arrangement and a pair of conventional amplifier systems joined to the last balanced stage of amplification in such a manner that, when the circuit is used for amplifying direct current, the polarity of the direct current applied to the input of the balanced input stage will be preserved so that this polarity will appear at the combined output of the two conventional amplifier systems.

It is a further object of the invention to provide an amplifying circuit having at least two balanced stages of amplification each comprising two tubes or two sets of tubes in bridge arrangement and two amplifier systems, one for each tube or set of tubes of the last balanced stage of amplification, having their outputs arranged in bucking relationship.

Still a further object of the invention is to provide an amplifying circuit having at least two balanced stages of amplification each comprising two tubes or two sets of tubes in bridge arrangement and two amplifier systems connected in parallel to the plates of the two tubes or sets of tubes of the last balanced stage with an electric valve preceding each amplifier system so that the output of the balanced system goes either into the one of the two amplifier systems or into the other, depending on the polarity of the current applied to the input of the first balanced stage.

Figure 1:
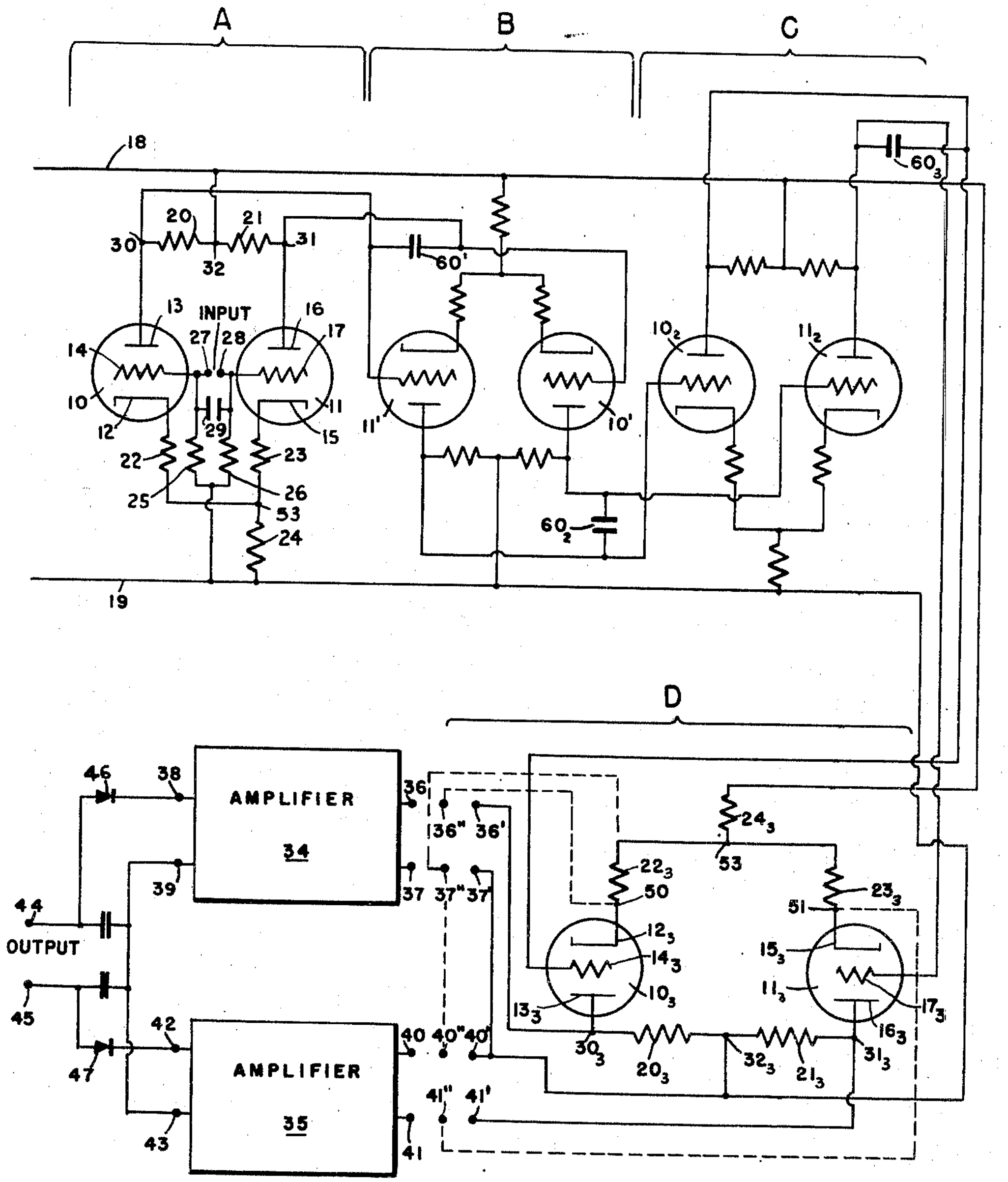

Other objects of the invention will appear as the description proceeds, reference being had to the accompanying drawings in which:

Fig. 1 shows a circuit comprising four balanced stages of amplification, the output of each tube of the last balanced stage being connected to one of two amplifier systems; and Fig. 2 shows the plates of the two tubes of the last balanced stage of amplification connected in parallel with both of two amplifiers.

Fig. 1 shows a circuit wherein four balanced or bridge stages are used, but any other number of balanced stages, such as two or three or more than four, may be used. The four balanced systems of Fig. 1 are generally indicated by the reference letters A, B, C and D. The first balanced stage A comprises two amplifier tubes 10 and 11 arranged in parallel. Tube 10 has a cathode 12, a plate 13 and between said cathode and plate at least a control grid 14, and tube 11 likewise comprises a cathode 15, a plate 16, and between these two electrodes 15, 16 at least one grid 17. Plate 13 of tube 10 is connected through a load impedance 20 to the one line 18 of a supply of alternating current of any suitable wave shape which may be derived from any suitable source, such as the commercial line supply, a vacuum tube oscillator or some other generator of alternating current. In parallel to plate 13, plate 16 of tube 11 is connected to said supply line 18 by means of a load impedance 21. Cathode impedances 22 and 23 connect, respectively, the cathodes 12 and 15 of the two tubes 10 and 11 to the second line 19 of the A. C. current supply, preferably through a resistor 24. The impedances 20, 21, 22 and 23 may be of any suitable nature, e. g. ohmic resistors, vacuum tubes, or inductance coils, and each pair of impedances may form a potentiometer whose center point, e. g. point 32 between the load impedances 20, 21, is adjustable by a slide arm as conventional with potentiometers. 25 and 26 denote grid resistors for the two control grids 14 and 17, and 27 and 28 are terminals to which an external voltage to be amplified in the circuit may be applied. The terminals 27, 28 may be shunted by a condenser 29 in order to reduce the pick-up of stray fields.

The tubes 10, 11 are of identical nature and the plate impedance, the cathode impedance and the grid resistor belonging to tube 10 have the same sizes as the corresponding elements belonging to tube 11. Thus a bridge circuit is formed wherein the two tubes 10, 11 in series with the cathode impedances 22, 23 form the one pair of bridge arms and the plate impedances 20, 21 the two other bridge arms. As long as no external voltage is applied to the grids 14 and 17 or to one of these grids, the bridge is balanced and there is no potential difference between point 30 connected to the plate of the tube 10 and point 31 connected to the plate of the tube 11, the voltage drops across the plate impedances 20 and 21 being equal.

When an external voltage is applied to either grid 14 or 17 or both, by connecting this external voltage either between one of the supply lines 18, 19 and one of the terminals 27, 28 or between these two terminals 27, 28, the balanced condition described will no longer exist. Assuming that the external voltage be applied between the grids 14 and 17 and be of such polarity as to make the grid 14 of tube 10 more positive than the grid 17 of tube 11, then point 30 will be more positive than point 31 and the potential difference arising between the points 30 and 31 will be proportional to, and larger than, the applied external voltage and of definite direction. If the polarity of the external voltage changes, so that the grid 17 becomes more positive than the grid 14, then of the two points 30 and 31 the latter becomes more positive and there will exist a potential difference in the direction from 31 towards 30, opposite to what it was before. The magnitude of the potential difference between the points 31 and 30 is again proportional to, but larger than, the magnitude of the external voltage.

The intermediate stages B and C are constructed similarly to the stage A except that the input terminals 27 and 28 and the grid resistors 25 and 26 are omitted. The final stage D is similar to the intermediate stages B and C but has output terminals 50 and 51 between the cathodes and the cathode impedances of the two tubes of the stage. Those parts of the stages B, C and D which correspond to parts of the stage A are denoted by reference numerals corresponding with those which are used for the stage A but followed by indices 1, 2 and 3 for the stages B, C and D, respectively.

All the balanced stages A, B, C, D are supplied with alternating current through the leads 18 and 19 and the connection of the stages A, B, C and D to these leads is so that each two consecutive stages operate with a phase difference of 180°. The plates of the tubes 10 and 11 of the stage A and of the tubes $10_2$ and $11_2$ of the stage C are connected to the line 18, whereas the cathodes of these tubes 10, 11, $10_2$ and $11_2$ are connected to the line 19. Of the tubes $10_1$ and $11_1$ of the stage B and $10_3$ and $11_3$ of the stage C, the cathodes are connected to the line 18 and the plates to the line 19.

The grids of each consecutive stage are directly coupled with the corresponding plates of the respective preceding stage. However, across the grids of the two tubes of each of the stages B, C and D there is arranged a common storage condenser, the condenser for the stage B being indicated at $60_1$, that for the stage C at $60_2$, and that for the stage D, at $60_3$. Each of the stages A, B, C and D will conduct current only through one-half of each cycle of the alternating current carried by the supply lines 18, 19. In particular, the stages A and C will be conductive during the one half cycle and the stages B and D during the other half cycle of the alternating current. Considering now the two stages A and B, it will be apparent that these two stages will be operative only alternatively, which is to say, that stage B will become conductive only after the preceding stage A has reached the end of its conductive half-cycle and will remain so conductive for half a cycle during which period the stage A is non-conductive. After that, stage A becomes again conductive and stage B non-conductive. Thus, the two stages A and B are never operative at the same instance and consequently these two stages are effectively electrically separated from each other and regeneration or other interaction of the circuits of the two stages is greatly minimized. The capacitor $60_1$ stores a portion of the output of the stage A while the latter is in its conductive phase and will impress a voltage upon the grid circuits of the stage B during the next half cycle when the stage A has ceased to be conductive.

What has been said in regard to the stages A and B applies to the relationship of the stages B and C and also of the stages C and D so that any two consecutive stages are separated from each other, being at a phase difference of 180° relative to the preceding as well as to the following stage.

All the four bridge stages A, B, C and D are in balanced condition as long as no external voltage is applied to either grid 14, 17 or to both these grids of the bridge stage A and no potential difference will exist at the end points $30_3$ and $31_3$ of the load impedances $20_3$ and $21_3$, since the voltage drops across the load impedances are of equal magnitude. If an external voltage is applied to the grid or grids of the balanced system A this will cause an unbalance so that one of the points 30, 31 will become more positive than the other, resulting in a potential difference of definite direction between these points 30 and 31. This potential difference, which again is proportional to, and larger than, the applied external voltage, is carried through the three further bridge stages B, C and D, undergoing a further amplification in each of those stages.

The points $30_3$, $31_3$ and $32_3$ of the last balanced stage D are shown connected to terminals 36', 41', 37' and 40' so that connection may be established with the input terminals 36, 41, 37 and 40 of a pair of similar amplifier systems 34 and 35 of conventional design having identical gains.

The two amplifier systems 34, 35 have their own power supply system or systems supplying the tubes with direct current. 36 and 37 are input terminals and 38 and 39 exit terminals of the amplifier system 34, whereas 40 and 41 denote input terminals and 42 and 43 exit terminals of the amplifier system 35. The voltage appearing across the load impedance $20_3$ is impressed upon the amplifier system 34 by means of the point $30_3$ being connected to the terminal 36 and the point $32_3$ to the terminal 37, whereas the voltage across the load impedance $21_3$ is impressed upon the amplifier system 35 by means of the input terminals 40, 41 of this amplifier system being connected to the ends $32_3$ and $31_3$ of the load impedance $21_3$. The exit terminal 39 of the amplifier system 34 is connected to the exit terminal 43 of the amplifier system 35 and the respective other exit terminals 38 and 42 of the two amplifier systems are connected to two outer terminals 44 and 45, each through a rectifier 46 and 47, respectively. Thus the outputs of the two amplifier systems 34 and 35 are connected in bucking relationship to each other.

When no external voltage is applied to the control grid of one of the tubes 10, 11 or to the control grids of both said tubes 10, 11 of stage A, then, due to the power supplied to the tubes through the lines 18, 19, both load impedances $20_3$ and $21_3$ and each of the two amplifying systems 34 and 35 will be impressed with input voltages of identical magnitude. Therefore, the voltage appearing at the exit terminals 38, 39 of the amplifying system 34 will be the same as the voltage between the exit terminals 42, 43 of the amplifying system 35 and on account of the bucking connection between the exits of the two amplifying systems the voltage difference appearing at the output terminals 44 and 45 will be zero. If, however, an external voltage is applied to the control grid or grids of the tubes 10, 11 of the first balanced amplification stage A, the voltage developed across the load impedance $20_3$ will be different from the voltage across the load impedance $21_3$, so that the two amplifying systems 34 and 35 will have different input voltages. Consequently, a voltage will appear at the output terminals 44 and 45 and this voltage is proportional to the difference of the voltages across the load impedances $20_3$ and $21_3$. If the external voltage applied to the control grid or grids of the tubes 10, 11 is D. C., then the potential difference between the output terminals 44 and 45 is of definite direction depending on the polarity of said applied external voltage. When this polarity changes, the direction of the potential difference at the output terminals 44, 45 changes correspondingly. Thus, all changes in the magnitude and/or polarity of the applied external voltage are transmitted from the input of the balanced amplification stage all the way through to the output terminals 44, 45 under maintenance of a zero axis throughout.

The pair of amplifier systems 34 and 35, instead of being connected to the balanced stages A to D in the manner shown in Fig. 1, may be connected in the manner shown in Fig. 2, in which latter figure of the four balanced stages A to D there is shown only the last stage D. Point $30_3$ at the plate end of the load impedance $20_3$ is connected in parallel with the input terminal 36 of the amplifier system 34 and with the input terminal 40 of the amplifier system 35, in each of these two parallel connections there being inserted an electric valve 48 and 49, respectively. The two valves 48, 49 form together a gate in that these valves are operative in opposite directions. Valve 48 allows the passage of a current of one polarity, e. g. positive polarity, only, whereas valve 49 will permit the passage of currents of the opposite polarity, e. g. negative currents, only. Point $31_3$ at the plate end of the load impedance $21_3$ is likewise connected in parallel to both amplifier systems 34 and 35, the connection to the amplifier system 34 being at the input terminal 37 and the connection to the system 35 at the input terminal 41.

Whereas in the circuit of Fig. 1 the voltages across the impedances $20_3$ and $21_3$ are each amplified separately, the one voltage in the amplifier system 34 and the other voltage in the amplifier system 35, in the circuit of Fig. 2 it is the difference of the two voltages across the impedances $20_3$, $21_3$ which is amplified in the two amplifier systems 34 and 35. Depending on whether the plate $13_3$ or the plate $16_3$ is more positive, the resulting voltage difference between the points 30 and 31 passes either through the valve 48 or the valve 49. If 48 is the valve permitting the passage of positive currents and 49 the valve admitting negative currents, then, since 48 controls the input to the amplifier system 34 and 49 the input to the amplifier system 35, the resulting differential voltage between the points 30 and 31 will be introduced through the valve 48 into the amplifier system 34 if the plate $13_3$ of tube $10_3$ is relatively more positive, but through the valve 49 into the amplifier system 35 if the plate $16_3$ of the tube 11 is more positive. Since in this arrangement always only one of the two amplifier systems 34, 35 is operative at any instant, the exit terminals 38, 39, 42 and 43 may be connected with each other and with the output terminals 44 and 45 either in the bucking manner as shown in Fig. 1 or, as shown in Fig. 2, an adding series connection may be used. In either case the voltage appearing at the output terminals 44, 45 is a proportional multiple of the unbalancing external voltage applied to the grid of one of the tubes 10, 11 of the first balanced amplification stage or to the control grids of both said tubes. The polarity of this voltage appearing at the output terminals 44, 45 changes according to the polarity changes of the unbalancing voltage.

Whereas in Figs. 1 and 2 as described thus far the output voltage has been obtained from the plate circuit including the plate impedances 20 and 21, the output voltage may be taken from the cathode circuit in which case the voltage drops across the cathode impedances $22_3$ and $23_3$ are subtracted from each other. If the output is so taken from the cathode circuit such as at the terminals 50 and 51, a lower impedance output results than if the output is taken from the plate circuit. The point 50 may be connected to a terminal 36'' and the point 51 to a terminal 41'' whereas the center point 53 may be connected to two terminals 37'' and 40'' to enable again the connection to the input terminals 36, 41, 37 and 40 of the two amplifier systems 34 and 35.

Where the amplification obtainable by the cascade of the balanced stages A, B, C, D is sufficient to transform the minute external voltage applied to the input of the first stage A into a satisfactorily high output voltage at either the points $30_3$ and $31_3$ or the points 50 and 51, then these points 30 and 31 (or the terminals 36' and 41′ connected therewith) or 50 and 51 (or the terminals 36″ and 41″ connected therewith) may be used directly as output terminals, dispensing with the two amplifier systems 34 and 35.

While I have shown in the drawing two particular embodiments of my invention, I desire it to be understood that these particular embodiments have been given by way of example only and that various modifications and re-arrangements of the details of the circuits shown may be made without departing from the spirit of the invention or the scope of the appended claims. For example, while triodes are shown in the drawings, tubes with a plurality of grids, e. g. pentodes, may be used. Or, while each of the balanced stages is shown as comprising two tubes in parallel, there may be several tubes connected in series for each of the tubes shown in the drawing, etc.

What I claim is:

1. An amplifying circuit comprising a plurality of balanced bridge circuits in cascade, two of the bridge arms of each of said bridge circuits including each at least one amplifier tube having a cathode, a plate and at least a control grid and the other two bridge arms of each of said bridge circuits including each a load impedance for one of said two amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supplies to the tubes of any bridge circuit being of the same phase and the power supplies to the tubes of any two subsequent bridge circuits differing in phase by 180°, and a storage condenser so arranged as to be common as a connection between either of the output electrodes of the two balanced tubes of any preceding bridge circuit and one of the input grids of the two balanced tubes of the respective subsequent bridge circuit.

2. An amplifying circuit comprising a plurality of balanced bridge circuits in cascade, two of the bridge arms of each of said bridge circuits including each at least one amplifier tube having a cathode, a plate and at least a control grid and the other two bridge arms of each of said bridge circuits including each a load impedance for said amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supplies to the tubes of any bridge circuit being of the same phase and the power supplies to the tubes of any two subsequent bridge circuits differing in phase by 180°, a storage condenser so arranged as to be common as a connection between either of the output electrodes of the two balanced tubes of any preceding bridge circuit and one of the input grids of the two balanced tubes of the respective subsequent bridge circuit, a pair of additional amplifier systems having identical gains, said two additional amplifier systems being connected in parallel to the output of the last of said bridge circuits in cascade so as to derive from the last named bridge circuit the difference of the voltages created across the load impedances for said two amplifier tubes of that last named bridge circuit, an electric valve preceding each of said two additional amplifier systems, said two valves being arranged to be operative in opposite directions so that one of said two valves allows the passage of current of one polarity only and the other valve the passage of current of the opposite polarity only and thus the output of the last of said bridge circuits is delivered either into the one of said two additional amplifier systems or into the other, depending on the polarity of the said unbalancing external voltage applied to the grid circuit or circuits of said first of said bridge circuits in cascade.

3. An amplifying circuit comprising a plurality of balanced bridge circuits in cascade, two of the bridge arms of each of said bridge circuits including each at least one amplifier tube having a cathode, a plate and at least a control grid and a cathode impedance in series with said cathode, and the other two bridge arms of each of said bridge circuits including each a plate impedance for said amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supplies to the tubes of any bridge circuit being of the same phase and the power supplies to the tubes of any two subsequent bridge circuits differing in phase by 180°, a storage condenser so arranged as to be common as a connection between either of the output electrodes of the two balanced tubes of any preceding bridge circuit and one of the input grids of the two balanced tubes of the respective subsequent bridge circuit, and two output terminals each connected between the cathode of one of said tubes of the last of said bridge circuits in cascade and its coordinated cathode impedance.

4. An amplifying circuit comprising a plurality of balanced bridge circuits in cascade, two of the bridge arms of each of said bridge circuits including each at least one amplifier tube having a cathode, a plate and at least a control grid and a cathode impedance in series with said cathode, and the other two bridge arms of each of said bridge circuits including each a plate impedance for said amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supply to the tubes of any bridge circuit being of the same phase and the power supplies to the tubes of any two subsequent bridge circuits differing in phase by 180°, a storage condenser so arranged as to be common as a connection between either of the output electrodes of the two balanced tubes of any preceding bridge circuit and one of the input grids of the two balanced tubes of the respective subsequent bridge circuit, two output terminals each connected between the cathode of one of said tubes of the last of said bridge circuits in cascade and its coordinated cathode impedance, a pair of additional amplifier systems for further amplifying the amplified voltage appearing at said output terminals, said pair of additional amplifier systems having a common output and being joined to said output terminals of said last of said balanced bridge circuits so as to preserve the polarity of said unbalancing external voltage beyond said first of said bridge circuits in cascade all the way through said pair of additional amplifier systems and in the common output of said pair of amplifier systems.

5. An amplifying circuit comprising a plurality of balanced bridge circuits in cascade, two of the bridge arms of each of said bridge circuits including each at least one amplifier tube having a cathode, a plate and at least a control grid and a cathode impedance in series with said cathode, and the other two bridge arms of each of said bridge circuits including each a plate impedance for said amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supply to the tubes of any bridge circuit being of the same phase and the power supplies to the tubes of any two subsequent bridge circuits differing in phase by 180°, a storage condenser so arranged as to be common as a connection between either of the output electrodes of the two balanced tubes of any preceding bridge circuit and one of the input grids of the two balanced tubes of the respective subsequent bridge circuit, two output terminals each connected between the cathode of one of said tubes of the last of said bridge circuits in cascade and its coordinated cathode impedance, a pair of additional amplifier systems having identical gains, said pair of additional amplifier systems being connected to said two output terminals so that the one of said pair of amplifier systems receives the voltage developed across the cathode impedance for the one of said two amplifier tubes of said last of said bridge circuits in cascade and the other of said pair of amplifier systems the voltage developed across the cathode impedance for the other of said two amplifier tubes.

6. An amplifying circuit comprising a plurality of balanced bridge circuits in cascade, two of the bridge arms of each of said bridge circuits including each at least one amplifier tube having a cathode, a plate and at least a control grid and a cathode impedance in series with said cathode, and the other two bridge arms of each of said bridge circuits including each a plate impedance for said amplifier tubes, terminals connected with the grid circuit of at least one of said tubes of the first of said bridge circuits in cascade for the application of an unbalancing external voltage, a source of alternating current for supplying power to the discharge paths across said tubes of said bridge circuits of the cascade, the power supply to the tubes of any bridge circuit being of the same phase and the power supplies to the tubes of any two subsequent bridge circuits differing in phase by 180°, a storage condenser so arranged as to be common as a connection between either of the output electrodes of the two balanced tubes of any preceding bridge circuit and one of the input grids of the two balanced tubes of the respective subsequent bridge circuit, two output terminals each connected between the cathode of one of said tubes of the last of said bridge circuits in cascade and its coordinated cathode impedance, a pair of additional amplifier systems having identical gains, said two additional amplifier systems being connected in parallel to said two output terminals so as to derive from said last of said bridge circuits in cascade the difference of the voltages created across the cathode impedances for said two amplifier tubes of that last named bridge circuit, an electric valve preceding each of said two additional amplifier systems, said two valves being arranged to be operative in opposite directions so that one of said two valves allows the passage of current of one polarity only and the other valve the passage of current of the opposite polarity only and thus the output of the last of said bridge circuits is delivered either into the one of said two additional amplifier systems or into the other depending on the polarity of the said unbalancing external voltage applied to the grid circuits or circuits of said first of said bridge circuits in cascade.

ALFRED A. ROGERS.

REFERENCES CITED

The following references are of record in the file of this patent:

UNITED STATES PATENTS

| Number | Name | Date |
|---|---|---|
| 2,085,488 | Woodward et al. | June 29, 1937 |
| 2,403,955 | Schlesinger | July 16, 1946 |
| 2,432,826 | Smith | Dec. 26, 1947 |
| 2,434,822 | Van Beuren et al. | Jan. 20, 1948 |
| 2,436,741 | Bussey | Feb. 24, 1948 |